United States Patent [19]
>
> Rode

[11] 4,050,964
[45] Sept. 27, 1977

[54] GROWING SMOOTH EPITAXIAL LAYERS ON MISORIENTED SUBSTRATES

[75] Inventor: Daniel Leon Rode, Murray Hill, N.J.

[73] Assignee: Bell Telephone Laboratories, Incorporated, Murray Hill, N.J.

[21] Appl. No.: 660,472

[22] Filed: Feb. 23, 1976

Related U.S. Application Data

[63] Continuation-in-part of Ser. No. 636,564, Dec. 1, 1975, abandoned.

[51] Int. Cl.² .................. H01L 21/208; H01L 21/205
[52] U.S. Cl. .................................. 148/171; 148/172; 148/175; 252/62.3 GA; 357/23; 357/60; 148/1.5
[58] Field of Search ................ 148/171, 172, 175; 252/623 GA; 357/23, 60

[56] References Cited

U.S. PATENT DOCUMENTS

| | | | |
|---|---|---|---|
| 3,146,137 | 8/1964 | Williams | 148/175 |
| 3,325,314 | 6/1967 | Allegretti | 148/175 |
| 3,379,584 | 4/1968 | Bean et al. | 148/175 |
| 3,471,324 | 10/1969 | Wilson et al. | 148/175 X |
| 3,476,592 | 11/1969 | Berkenblit et al. | 148/175 X |
| 3,632,431 | 1/1972 | Andre et al. | 148/171 X |
| 3,899,371 | 8/1975 | Ladany | 148/172 X |
| 3,920,492 | 11/1975 | Sugita et al. | 357/60 |

OTHER PUBLICATIONS

Blom et al., Liquid Phase Epitaxy, North-Holland Publishing Co., Amsterdam, Netherlands, 1974, pp. 148–153.
Rode, J. Crystal Growth, vol. 27, (1974), pp. 313–315.

*Primary Examiner*—G. Ozaki
*Attorney, Agent, or Firm*—Michael J. Urbano

[57] ABSTRACT

A process for improving the smoothness of semiconductor layers grown by epitaxy is described. Smooth epitaxial layers, free of crystal terraces, are attained by misorienting the growth surface of the substrate from a major crystallographic plane by a small critical angle approximately equal to the tread-to-riser angle of terraces which would be formed if the epitaxial layer were deposited on a growth surface nominally parallel to the major plane. The critical angle is a function of both the growth temperature and the crystal composition. Specific examples for the growth of LPE $Al_xGa_{1-x}As$ at various growth temperatures and values of $x$ on GaAs substrates misoriented from the (100) and (111)B major planes are given. Also described are examples of silicon layers grown by CVD on (111) substrates to measure the critical angle in the $(\overline{1}\overline{1}2)$ direction.

8 Claims, 2 Drawing Figures

GROWING SMOOTH EPITAXIAL LAYERS ON MISORIENTED SUBSTRATES

CROSS REFERENCE TO RELATED APPLICATIONS

This application is a continuation-in-part of my copending application Ser. No. 636,564, filed on Dec. 1, 1975 now abandoned.

BACKGROUND OF THE INVENTION

This invention relates to the epitaxial growth of semiconductor layers and, more particularly, to the growth of smooth layers on misoriented semiconductor substrates.

One of the more perplexing problems which consistently arises in the epitaxial growth of semiconductor layers is the presence of aberrations in surface morphology which render it difficult to obtain smooth surfaces and uniformly thick layers. In one application, for example, GaAs and AlGaAs layers are commonly grown by LPE on GaAs substrates in the fabrication of optical waveguides and junction lasers. In such devices it has become especially important to achieve extremely uniform, thin layers which may be only 1500 Angstroms thick. The degree of uniformity required can best be understood by reference to a specific example of a GaAs junction laser characterized by bandgap emission at a wavelength about 9000 Angstroms in vacuum (2500 Angstroms in the material). A typical requirement for uniformity specifies that the layers of the active region be optically flat, i.e., smooth to one-tenth of a wavelength, about 250 Angstroms. However, these devices are frequently grown by LPE on (100) or (111)B GaAs substrates which give rise to certain fundamental crystal interface instabilities. These instabilities manifest themselves as terraces which give the layers a shingled or rippled morphology with roughness of about 400 to 800 Angstroms, in excess of that specified for optical flatness.

Although terraces can theoretically be eliminated by orienting the substrate precisely along a major crystallographic plane, in practice crystal cutting techniques are accurate only to tolerances of about ± 0.1°. Even such a small deviation is sufficient to create terraces in epitaxial layers as disclosed by D. L. Rode in FIG. 1 of *J. Crystal Growth*, Vol. 27, pp. 313-315 (1974; actual publication date — Jan. 17, 1975) for the case of a GaAs layer grown by LPE on a GaAs substrate misoriented by only about 0.07°.

SUMMARY OF THE INVENTION

In accordance with an illustrative embodiment of the invention, the smoothness of epitaxial semiconductor layers is improved by misorienting the growth surface of the substrate by a small critical angle approximately equal to the tread-to-riser angle of terraces which would be formed if the layer were deposited on a growth surface nominally parallel to a major crystallographic plane. The critical angle decreases with increasing growth temperature and is a function of crystal composition. The direction along which the substrate is misoriented, however, does not appear to be critical for Group III(a)-V(a) compounds.

Thus, for example, layers of $Al_xGa_{1-x}As$ have been grown by LPE on misoriented (100) GaAs substrates. At a growth temperature $T_g$ of 780° C, the critical angle $\theta_c$ ranged from about 0.91° to 0.24° for $x$ in the range of 0 to 0.36. Similarly, for $x = 0$, $\theta_c$ ranged from about 1.12° to less than about 0.2° for $T_g$ in the range of 730° to 880° C.

In contrast, when $Al_xGa_{1-x}As$ was grown on misoriented (111)B GaAs substrates at $T_g = 780°$ C, $\theta_c$ ranged from about 1.08° to 0.42° for $x$ in the range of 0 to 0.36. Similarly, for $x = 0$, $\theta_c$ ranged from about 0.99 to 0.73 for $T_g$ in the range of 730° to 830° C. With respect to $Al_xGa_{1-x}As$ layers, therefore, it can be concluded that $\theta_c$ decreases with increasing $x$.

Terraces also appear in the epitaxial growth of other Group III(a)-V(a) compounds such as GaP, InP and GaSb. In addition, pyramids, which are analagous to terraces, form in the CVD growth of epitaxial silicon. It is expected, therefore, that smoother epitaxial layers can be attained by applying the principles of the invention to these materials, as well as to semiconductors in general.

BRIEF DESCRIPTION OF THE DRAWING

The invention, together with its various features and advantages, can be readily understood from the following more detailed description, in which.

DETAILED DESCRIPTION

Figure 1:
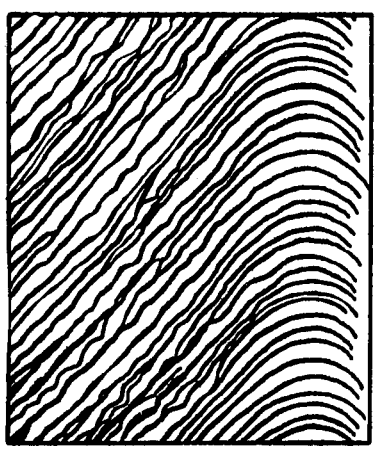
FIG. 1 depicts a Nomarski contrast micrograph showing terraces on a 3μm thick GaAs layer grown by LPE (growth rate about 0.1μm/min at 780° C) on a nominally (100) GaAs substrate (misoriented by $\phi = 0.07°$)
Figure 2:
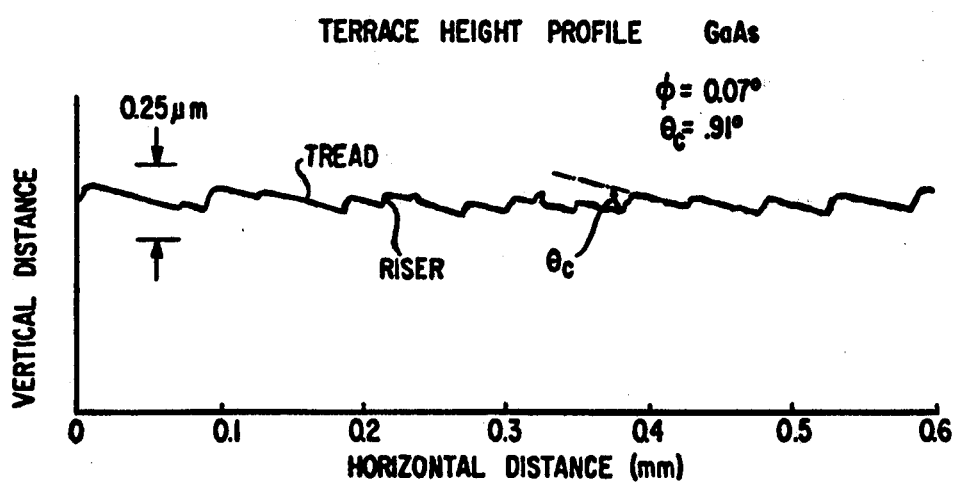
FIG. 2 is a Talysurf height profile of the layer of FIG. 1 showing the angle $\theta_c = 0.91°$ between the tread and riser of a terrace (note the 200:1 vertical-to-horizontal magnification).

In order to graphically depict the manner in which the invention is implemented, consider the specific example of a GaAs layer grown by LPE at 780° C on a nominally (100) GaAs substrate. As mentioned previously, if the substrate were cut precisely along the (100) plane, then no terraces would be formed. However, even slightly misorienting the substrate by only $\phi = 0.07°$ results in numerous terraces as depicted in FIG. 1. Using wellknown Talysurf equipment by Rank Cherr-Tumico Inc., the height profile of the layer was plotted as shown in FIG. 2. Then the angle $\theta_c$ between the tread and riser of each of a plurality of terraces was measured. The angles were averaged to yield $\theta_c = 0.9°$ approximately.

In accordance with the invention, however, misorienting the substrate by approximately $\theta c$ virtually eliminates the terraces and results in smoother epitaxial layers. As mentioned previously, $\theta_c$ is the tread-to-riser angle, where the tread is typically a major crystallographic plane and the riser is a stable surface or crystal facet. A stable surface or riser is defined in terms of the variation of crystal surface energy $E_s$ versus substrate misorientation $\theta$; that is, a stable surface has a minimum surface energy at $\theta_c$ approximately. Put another way, $dE_s/d\theta$ is 0 at about $\theta_c$ for a stable surface, whereas an unstable surface has no such minimum. If the substrate misorientation is less than $\theta_c$ (but not precisely 0), the crystal surface is in tension and terraces are formed during epitaxial growth. On the other hand, if the substrate misorientation is greater than $\theta_c$, compression sets in and during growth hill-and-valley instabilities are formed (i.e., an undulating surface).

The above procedure was repeated for several compositions of $Al_xGa_{1-x}As$ on GaAs substrates nominally oriented (100) or (111)B and for LPE growth temperatures in the range of 730° C to 880° C. The critical angles $\theta_c$ were measured and tabulated below.

Table I

| x | Sub. Orient. | Growth Temperature $T_g$ Degrees C | | | |
|---|---|---|---|---|---|
| | | 730 | 780 | 830 | 880 |
| 0 | (100) | 1.12 | 0.91 | — | <0.2 |
| | (111) | 0.99 | 1.08 | 0.73 | — |
| 0.18 | (100) | 0.42 | 0.36 | 0.33 | <0.2 |
| | (111) | 0.87 | 0.48 | 0.48 | 0.51 |
| 0.36 | (100) | — | 0.24 | 0.16 | <0.2 |
| | (111) | — | 0.42 | 0.44 | 0.60 |

Experimental error in the measurement of $\theta_c$ is about ten percent or ± 0.05, whichever is greater. Thus, within experimental error it can be seen than when $Al_xGa_{1-x}As$ ($x=0$ to 0.36) is epitaxially deposited from the liquid phase on a nominally (111)B GaAs substrate at growth temperatures in the range of about 730° to 880° C, terraces are formed from which $\theta_c$ has been measured to range from about 1.0° to 0.5°. The corresponding range of $\theta_c$ for (100) GaAs substrates is about 1.1° to 0.2°.

In order to demonstrate that misorienting a substrate by $\theta_c$ virtually eliminates terraces, GaAs—AlGaAs double heterostructures (DH) were grown on nominally (100) GaAs:Si substrates and on GaAs:Si substrates misoriented from (100) by $\theta_c = 0.9° \pm 0.1°$. Standard boat and slider apparatus was used to grow the layers by LPE at a growth temperature of 780° C and a cooling rate of about 0.1° C/min. In particular, on the substrate were grown the following layers for devices identified as LZ106 (nominally (100) substrate, and LZ115 and LF711 (substrates misoriented by about 0.9° ± 0.1°): an $n-Al_{.36}Ga_{.64}As$ layer about 2.0 μm thick, a $p$-GaAs layer (the active region) about 0.15 μm thick, a $p$-$Al_{.36}Ga_{.64}As$ layer about 0.8 μm thick and a p-GaAs layer about 1.2 μm thick (LZ115) or a $p$-$Al_{.36}Ga_{.64}As$ layer about 1.2 μm thick (LF711).

Inasmuch as these devices are useful as DH junction lasers, the smoothness of the active region, where stimulated radiation is generated, is especially important. The presence of terraces in the active region increases losses and hence probably increases lasing thresholds as well. If the top layer of the DH is $p$-GaAs (LZ115), then terraces in the active region usually can be inferred from the presence of terraces in the top layer. Terraces in the top layer can be detected by standard Nomarski contrast micrographs. On the other hand, if the top layer is $p$-$Al_{.36}GA_{.64}As$ (LF711), then terraces in the active region may not be reflected in the top layer. However, using standard photoluminescence techniques, the $Al_{.36}Ga_{.64}As$ layers can be excited by green laser light to generate carriers which pump the active region. Terraces appear as a spatial intensity modulation of emission from the active region corresponding to a modulation of the thickness of the active region.

Nomarski contrast techniques were used to demonstrate that device LZ106 (nominally (100) substrate) exhibited terraces in the top layer and therefore probably had terraces in the active region, whereas in LZ115 (substrate misoriented from (100) by about 0.9° ± 0.1°) the terraces were virtually eliminated. Similarly, photoluminescence techniques were used to demonstrate that device LF711 (substrate misoriented from (100) by about 0.9° ± 0.1°) had no terraces in the active region.

Note that in multilayer structures including layers of different composition, such as DH junction lasers or waveguides, some compromise between $\theta_c$ for different layer compositions may be called for. If eliminating terraces in a particular layer (e.g., the action region of a DH laser) is more important than others, then $\theta$hd c should be chosen so that terraces are reduced or eliminated in that layer, even though they may be created elsewhere.

It is to be understood that the above described arrangements are merely illustrative of the many possible specific embodiments which can be devised to represent application of the principles of our invention. Numerous and varied other arrangements can be devised by those skilled in the art without departing from the spirit and scope of the invention. In particular, pyramids, which are analagous to terraces have been observed in epitaxial silicon layers grown by CVD on improperly misoriented silicon substrates. It is intended, therefore, that the term terraces as used herein includes pyramids and like crystal irregularities. For pyramids the critical angle is defined as the angle between a major crystallographic plane (analagous to a tread) and any stable surface which forms an inclined side of the pyramid (analagous to a riser). The epitaxial layers were grown on nominally (111) Si substrates by the reduction of $SiCl_4$ with $H_2$, a standard procedure. For growth temperatures in the range of about 950° C to 1200° C, the critical angle of $\theta_c$ ranges from about 1.10° ± 0.05° to 0.20° ± 0.05°. However, in contrast with Group III(a-)-V(a) compounds, for silicon the direction of misorientation was found to be important; that is, the substrate should be misoriented from the (111) plane (tread) in the direction of the ($\bar{1}12$) direction because in the ($\bar{1}12$) direction the crystal facet is a stable surface (riser). In contrast, in the opposite ($11\bar{2}$) direction the side of the pyramid is an unstable surface on which defects such as hillocks tend to form during epitaxial growth. Of course, it is well known that ($\bar{1}12$) is crystallographically equivalent to ($\bar{1}2\bar{1}$) and ($2\bar{1}1$), but is opposite to ($11\bar{2}$) which is equivalent to ($1\bar{2}1$) and ($\bar{2}11$). It is expected that misorienting (111) silicon wafers by $\theta_c$ in the ($\bar{1}12$) direction will virtually eliminate pyramids.

Finally, another type of surface defect known as meniscus-dissolution lines or rake-marks is observed in the LPE growth of GaAs-AlGaAs stripe geometry DH lasers on nominallly (100) GaAs substrates. These lines correspond to voids in the active region. They are roughly parallel and equally spaced and run normal to the direction of translation of the slider. Although the impact of rake-lines can be reduced by orienting the contact stripe parallel to the lines, it has been found that in relatively clean LPE systems rake-lines are eliminated (1) if the layers are grown instead on (111)B GaAs substrates, whether misoriented or not; or (2) if the layers are grown on GaAs substrates misoriented from (100) by about $\theta_c$; and the GaAs saturation seed(s) is misoriented a similar or greater amount (e.g., as much as 5° has proved effective). The purpose of misorienting the saturation seed is to produce a relatively large number of atomic steps on the seed. These steps act to relieve the supersaturation of the source solutions (especially ternary solutions such as AlGaAs), which, in turn, reduces the likelihood that rake-lines will occur. In this context, a conventional LPE system was employed; i.e., a solution holder having a plurality of wells in which source solutions are placed and a seed holder in which both a saturation seed(s) and the substrate are inserted. The seed holder is slidably positioned beneath the wells so that the saturation seed precedes the substrate under each well. For more detail see my article in *J. Crystal Growth*, Vol. 20, pp. 13-23 (1973).

What is claimed is:

1. A process of epitaxially depositing semiconductor material on a semiconductor substrate comprising the step of misorienting the growth surface from a crystallographic plane of the substrate by an angle approximately equal to the angle between the treads and risers of terraces which would be formed at the growth temperature if the epitaxial layer were deposited on a surface nominally parallel to said plane 2. The process of claim 1 wherein said material is a Group III(a)-V(a) compound.

3. The process of claim 2 wherein said material is deposited from the liquid phase using apparatus comprising: a solution holder having a plurality of wells for carrying source solutions of Group III(a) and Group V(a) materials and a seed holder for carrying a saturation seed and said substrate both of which comprise said Group III(a)-V(a) compound, said slider being slidably positioned beneath said wells so that said saturation seen precedes said substrate under each well; and wherein said saturation seed is misoriented by an angle at least as great as the angle by which said substrate is misoriented.

4. The process of claim 2 wherein said material comprises $Al_xGa_{1-x}As$ which is epitaxially deposited from the liquid phase on a GaAs substrate at growth temperatures in the range of about 730° C to 880° C and said substrate is misoriented from the (100) plane by angles in the range of about 1.1° to about 0.2° for $x$ in the range of 0 to 0.36.

5. The process of claim 2 wherein said material comprises $Al_xGa_{1-x}As$ which is epitaxially deposited from the liquid phase on a GaAs substrate at growth temperatures in the range of about 730° C to 880° C and said substrate is misoriented from the (111)B plane by angles in the range of about 1.0° to 0.5° for $x$ in the range of 0 to 0.36.

6. The process of claim 1 wherein said material comprises silicon which is epitaxially deposited from the vapor phase on a silicon substrate at growth temperatures in the range of about 950° C to 1200° C and said substrate is misoriented from the (111) plane in the ($\overline{1}12$) direction by angles in the range of about 1.10° to 0.20°.

7. A process of epitaxially depositing a layer of semiconductor material on a growth surface of a semiconductor substrate comprising the steps of:
 a. deriving a critical angle defined by the tread-to-riser angle of terraces which would be formed on said layer if said material were deposited on a plane nominally parallel to a major crystallographic plane of said substrate, and
 b. misorienting the growth surface from said plane by approximately said critical angle before depositing said layer thereon.

8. The process of claim 7 wherein step (a) includes epitaxially depositing a layer of said material on a growth surface of another substrate oriented along said plane, measuring the height profile of terraces thereby formed, and calculating said critical angle from said profile.

* * * * *

UNITED STATES PATENT AND TRADEMARK OFFICE
CERTIFICATE OF CORRECTION

PATENT NO. : 4,050,964
DATED : September 27, 1977
INVENTOR(S) : Daniel L. Rode

It is certified that error appears in the above-identified patent and that said Letters Patent are hereby corrected as shown below:

Column 2, line 50, "θc" should read --$\theta_c$--.

Column 3, line 15, "than" should read --that--;
line 32, "substrate" should read --substrate)--.
Column 4, line 3, "θhd c" should read --$\theta_c$--;

line 16, "therefore" should read --therefor--.
Column 5, line 22, "seen" should read --seed--.

Signed and Sealed this

Second Day of May 1978

[SEAL]

Attest:

RUTH C. MASON
Attesting Officer

LUTRELLE F. PARKER
Acting Commissioner of Patents and Trademarks